United States Patent
Wu et al.

(10) Patent No.: US 10,163,690 B2
(45) Date of Patent: Dec. 25, 2018

(54) 2-D INTERCONNECTIONS FOR INTEGRATED CIRCUITS

(71) Applicant: Taiwan Semiconductor Manufacturing Co., Ltd., Hsinchu (TW)

(72) Inventors: Chia-Tien Wu, Taichung (TW); Hsiang-Wei Liu, Tainan (TW); Tai-I Yang, Hsinchu (TW); Wei-Chen Chu, Taichung (TW)

(73) Assignee: Taiwan Semiconductor Manufacturing Co., Ltd., Taiwan (CN)

( * ) Notice: Subject to any disclaimer, the term of this patent is extended or adjusted under 35 U.S.C. 154(b) by 0 days.

(21) Appl. No.: 15/389,060

(22) Filed: Dec. 22, 2016

(65) Prior Publication Data

US 2018/0151416 A1    May 31, 2018

Related U.S. Application Data

(60) Provisional application No. 62/428,372, filed on Nov. 30, 2016.

(51) Int. Cl.
| | |
|---|---|
| *H01L 21/768* | (2006.01) |
| *H01L 21/033* | (2006.01) |
| *H01L 23/522* | (2006.01) |
| *H01L 23/528* | (2006.01) |
| *H01L 21/311* | (2006.01) |

(52) U.S. Cl.
CPC .... *H01L 21/76816* (2013.01); *H01L 21/0335* (2013.01); *H01L 21/0337* (2013.01); *H01L 21/0338* (2013.01); *H01L 21/31144* (2013.01); *H01L 21/7684* (2013.01); *H01L 21/76877* (2013.01); *H01L 23/528* (2013.01); *H01L 23/5226* (2013.01)

(58) Field of Classification Search
CPC ....... H01L 2924/00; H01L 2924/00014; H01L 2924/13091; H01L 2224/9202; H01L 2924/14; H01L 2924/0002; H01L 23/528; H01L 27/11582; H01L 23/5226
See application file for complete search history.

(56) References Cited

U.S. PATENT DOCUMENTS

| | | | |
|---|---|---|---|
| 8,222,140 B2 * | 7/2012 | Tang | H01L 21/0337 257/E21.036 |
| 8,448,100 B1 | 5/2013 | Lin et al. | |

(Continued)

*Primary Examiner* — Tony Tran
(74) *Attorney, Agent, or Firm* — Sterne, Kessler, Goldstein & Fox P.L.L.C.

(57) ABSTRACT

Two-dimensional (2-D) interconnects in a one-dimensional (1-D) patterning layout for integrated circuits is disclosed. This disclosure provides methods of connecting even or odd numbered lines that are in the x-direction of a 1-D patterning layout through 2-D interconnects in the y-direction. Depending on device design needs, 2-D interconnects may be perpendicular or non-perpendicular to the even or odd numbered lines. The freedom of two-dimensional patterning compared to conventional self-aligned multiple patterning (SAMP) processes used in the 1-D patterning processes is provided. The two-dimensional patterning described herein provides line widths that match the critical dimensions in both x and y directions. The separation between the 1-D lines or between 2-D interconnects and the end of 1-D lines can be kept to a constant and at a minimum.

17 Claims, 11 Drawing Sheets

(56) References Cited

U.S. PATENT DOCUMENTS

| | | | |
|---|---|---|---|
| 8,631,372 B2 | 1/2014 | Yu et al. | |
| 8,669,780 B2 | 3/2014 | Chi | |
| 8,701,073 B1 | 4/2014 | Fu et al. | |
| 8,754,818 B2 | 6/2014 | Yen et al. | |
| 8,896,094 B2 | 11/2014 | Yen et al. | |
| 9,016,939 B2 | 4/2015 | Chang et al. | |
| 9,086,452 B2 | 7/2015 | Wang et al. | |
| 9,165,968 B2 | 10/2015 | Chao et al. | |
| 9,171,798 B2 | 10/2015 | Lin et al. | |
| 9,172,242 B2 | 10/2015 | Chang et al. | |
| 9,219,038 B2 | 12/2015 | Horng et al. | |
| 9,514,977 B2 * | 12/2016 | Morita | H01L 21/768 |
| 2013/0193981 A1 | 8/2013 | Chen et al. | |
| 2013/0246990 A1 | 9/2013 | Yen et al. | |
| 2013/0320553 A1 | 12/2013 | Kuo et al. | |
| 2014/0126274 A1 | 5/2014 | Lee et al. | |
| 2014/0167799 A1 | 6/2014 | Wang et al. | |
| 2014/0195728 A1 | 7/2014 | Hsu et al. | |
| 2014/0239427 A1 | 8/2014 | Huang et al. | |
| 2014/0266273 A1 | 9/2014 | Wang et al. | |

\* cited by examiner

2-D INTERCONNECTIONS FOR INTEGRATED CIRCUITS

BACKGROUND

Generally, integrated circuits (ICs) comprise individual devices, such as transistors, capacitors, or the like, formed on a substrate. Front-end-of-line (FEOL) is the first portion of IC fabrication where the individual devices (transistors, capacitors, resistors, etc.) are patterned in a wafer. Back end of line (BEOL) is the second portion of IC fabrication where the individual devices get interconnected with wiring or metal layers on the wafer. It includes interconnecting contacts, metal layers, and bonding sites for chip-to-package connections.

As technologies progress, ICs are characterized by decreasing dimension requirements over previous generation devices. However, such a decrease in dimensions is limited by the photolithography tools used in the fabrication of the devices. The minimum size of features and spaces fabricated by a photolithography tool is dependent upon the tool's resolution capabilities. Alternative methods may exist to provide for increased resolution capabilities and decreased minimum pitch (e.g., sum of the feature size and the width of a space between features); however, these methods may also fail to provide adequate critical dimensions. Additionally, the methods of reducing pattern size are often inefficient for example, adding costs and time to device fabrication.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1A:
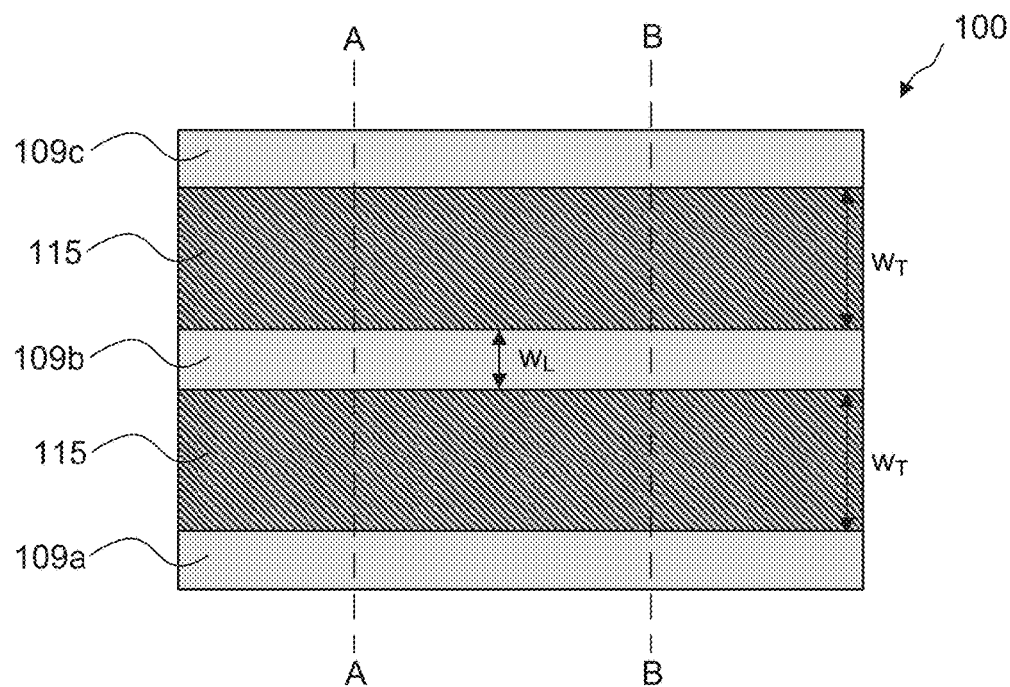
FIG. 1A is a top view of a partially fabricated, exemplary electrical interconnect arrangement suitable for use in integrated circuits having orientationally-constrained layouts, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

Various embodiments in accordance with this disclosure provide methods of producing two-dimensional (2-D) interconnects in a one-dimensional (1-D) patterning layout for integrated circuits, for example, metal lines. The terminologies of 2-D and 1-D refer to the directionality of the circuit layouts rather than the thickness or width of conductive lines. A pure 1-D layout is often used as a patterning solution when the minimum dimension of the layout patterning approaches the lithography limitations. However, the 2-D interconnects described in this disclosure provide freedom of two-dimensional patterning in a one-dimensional layout patterning. Specifically, even or odd numbered lines in the x-direction of the 1-D patterning layout can be connected through 2-D interconnects in the y-direction. Depending on the device design needs, the 2-D interconnects may be perpendicular or connected at an angle of less than 90 degrees to the even or odd numbered lines. Methods in accordance with this disclosure extend the resolution capability of currently available 1-D patterning layout into 2-D patterning. Various embodiments in accordance with this disclosure provide the freedom of two-dimensional patterning in multiple-exposure patterning processes used in 1-D patterning. Self-aligned multiple patterning (SAMP) processes such as self-aligned double patterning (SADP) or self-aligned quadruple patterning (SAQP) allow for a reduced feature pitch over single-exposure techniques. Self-aligned patterning techniques such as SADP improve pattern variability over other multiple-exposure techniques such as litho-etch-litho-etch (LELE) by eliminating some mask overlay variability.

One benefit of the methods in accordance with this disclosure is that the line widths of the even or odd numbered lines and the 2-D interconnects can be configured to match the critical dimension of the SAMP process.

Another benefit of the methods in accordance with this disclosure is that only minimum area is needed to achieve 2-D interconnect between 1-D lines, and that the separation between the 1-D lines or between 2-D interconnects and the end of 1-D lines can be kept to a constant and at a minimum. The constant minimum separation may be as low as the critical dimension of a SAMP process, or the resolution limit of the lithography apparatus used for fabricating these structures. For example, the critical dimension may be 5 nm or no larger than 30 nm. The constant minimum separation also provides the benefit that line-to-line leakage can be prevented in spite of overlay concerns. Line-to-line leakage, such as dielectric breakdown, is a reduction in insulator resistance when the voltage applied across the electrical insulator exceeds its breakdown voltage. Line-to-line leakage may result from the breakdown of an inter-metal dielectric (IMD) and cause a leakage current in adjacent lines. The line-to-line leakage problem continues to plague manufacturers of reduced geometry devices.

The capability of a 2-D layout in a 1-D based patterning provides the further benefit of an increased logic density and decreased metal layer stacking in integrated circuits. Such benefits find utility, for example, in a transmission gate or tie-off circuits where 2-D interconnections are highly advantageous. An example of tie-off circuits is an inverter latch circuit, where the output of an inverter circuit is connected to the input of another inverter circuit. Using such methods, the size of logic cells which contain transmission gates could be reduced in the y direction.

FIGS. 1A-8B provide various views of an integrated circuit that illustrate operations of 2-D interconnect fabrication. The fabrication process provided here is exemplary, and alternative processes in accordance with this disclosure may be performed that are not shown in these figures.

FIG. 1A is a top view of integrated circuit 100 with hard mask layer 115 and mandrels 109a-109c. Portions of hard mask layer 115 are exposed between adjacent mandrels 109a, 109b, and 109c, and have width $W_T$ which may be approximately equal to at least three times the critical dimension. Each mandrel has width $W_L$ which may be as low as the critical dimension, for example, 5 nm, or no larger than 30 nm. There may be more mandrels and exposed hard mask areas formed on the substrate, but are not shown here for simplicity.

Figure 1B:
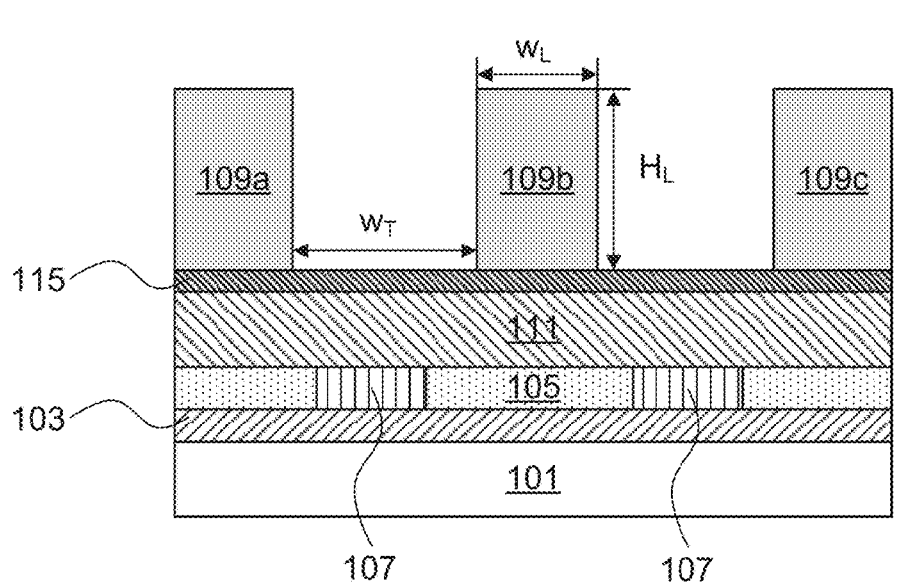
FIG. 1B is a cross-sectional view of the partially fabricated exemplary electrical interconnect arrangement of FIG. 1A taken across line A-A.

FIG. 1B is a cross-sectional view of integrated circuit 100 along line A-A of FIG. 1A. A cross-section taken along line B-B of FIG. 1A is the same. Substrate 101 may comprise doped or undoped bulk silicon, or an active layer of a silicon-on-insulator (SOI) substrate. Generally, an SOI substrate is a layered silicon-insulator-silicon substrate. Alternatively, other semiconductor material such as germanium, silicon germanium, or combinations thereof, may form the active layer over the insulator. Other substrates that may be used include multi-layered substrates, gradient substrates, or hybrid orientation substrates.

Active devices may be formed on and/or within substrate 101. A wide variety of active and passive devices such as transistors, diodes, capacitors, resistors, inductors and the like may be used to implement a desired circuit. The active devices may be formed using any suitable methods either within or else on the surface of substrate 101. FIG. 1B is simplified by omitting these devices for a better understanding of the present disclosure.

Multi-level interconnect (MTI) layer 103 is formed on substrate 101 and is designed to connect the various active devices to form functional circuitry. While illustrated in FIG. 1B as a single layer, multi-level interconnect layer 103 may comprise alternating layers of dielectric and conductive material and may be formed through any suitable process (such as deposition, damascene, dual damascene, etc.).

A first dielectric layer 105 is formed over multi-level interconnect layers 103. In an embodiment the first dielectric layer 105 may be a dielectric material formed using a deposition or spin-on process, depending upon the material chosen. For example, first dielectric layer 105 is made of a dielectric material and may be formed of silicon oxide, silicon nitride, silicon oxynitride, fluorine-doped silicate glass (FSG), a low-k dielectric material, $SiC_xO_yN_z$ (x, y, z=0~n), and/or other suitable insulating material. However, any other suitable dielectric material formed using any other suitable process may alternatively be utilized.

Conductive regions 107 are formed within openings in the first dielectric layer 105. In an embodiment, conductive regions 107 are regions to which an interconnect (not illustrated in FIG. 1B but illustrated and described below with respect to FIGS. 9A-9B), will make an electrical connection. In an embodiment, conductive regions 107 are conductive lines made from, e.g., copper, although any other suitably conductive material may alternatively be utilized. Conductive regions 107 may be formed using a damascene process, by which a portion of first dielectric layer 105 is removed to form an opening that is filled with the conductive material.

A second dielectric layer 111 and a hard mask layer 115 are formed over conductive regions 107 and first dielectric layer 105. Similar to first dielectric layer 105 described above, second dielectric layer 111 is made of a dielectric material and may be formed of silicon oxide, silicon nitride, silicon oxynitride, fluorine-doped silicate glass (FSG), a low-k dielectric material, $SiC_xO_yN_z$ (x, y, z=0~n), and/or other suitable insulating material. Hard mask layer 115 is made of dielectric material, for example, silicon oxide, silicon nitride, TiN, Si, TiO, WC, $SiC_xO_yN_z$ (x, y, z=0~n), and/or other suitable insulating material.

Mandrels 109a-109c are fin-shaped non-metallic structures that are formed over hard mask layer 115 and have height $H_L$ and width $W_L$. Height $H_L$ may be about 1-3 times the critical dimension, and width $W_L$ may be as low as the critical dimension, depending on the device needs. Each mandrel has sidewalls that are approximately perpendicular to a surface of hard mask layer 115. Mandrel separation $W_T$ is at least three times of the critical dimension. Mandrels 109a-109c are made of non-metallic dielectric material, for example, silicon oxide, silicon nitride, TiN, Si, TiO, WC, $SiC_xO_yN_z$ (x, y, z=0~n), and/or other suitable insulating material.

First dielectric layer 105, second dielectric layer 111, hard mask layer 115, and mandrels 109a-109c may be formed by chemical oxidation, thermal oxidation, atomic layer deposition (ALD), chemical vapor deposition (CVD), and/or other suitable formation process. Any other suitable dielectric material formed using any other suitable process may alternatively be utilized. Other process may be included in the formation process, for example, a photolithography process is used to define mandrels 109a-109c, and a chemical mechanical polishing (CMP) process may be used to planarize selected surfaces.

Note that multi-level interconnect layer 103, first dielectric layer 105, conductive regions 107, second dielectric layer 111, and hard mask layer 115 may not be required for forming the 2-D interconnects in integrated circuit 100.

Figure 2A:
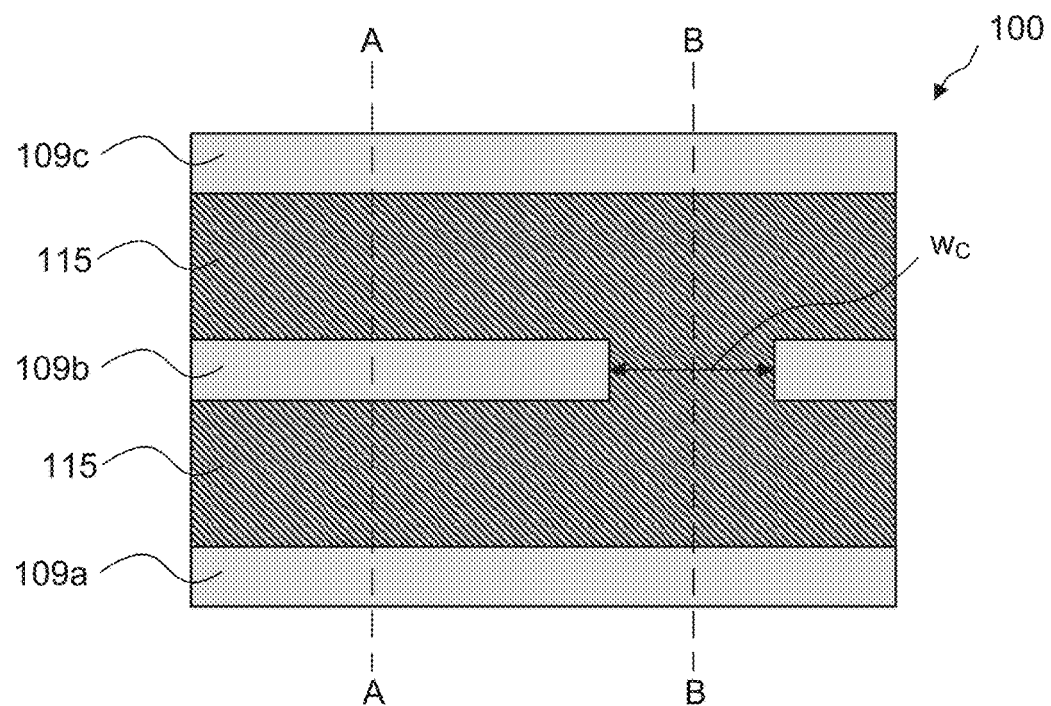
FIG. 2A is a top view of the partially fabricated, exemplary electrical interconnect arrangement after a photolithography process, in accordance with some embodiments.

FIG. 2A is a top view of integrated circuit 100 after a portion of mandrel 109b has been removed using photolithography and etch processes. An exemplary photolithography process to remove a portion of mandrel 109b includes forming a photoresist layer over the surface of integrated circuit 100, exposing the resist to a cut mask having a pattern thereon, performing a post-exposure bake process, and developing the resist to form a masking element including the resist. The area of mandrel 109b that is not protected by the masking element is etched using, for example, a reactive ion etching (RIE) processes and/or other suitable processes. The photoresist layer is subsequently removed by any suitable resist strip process. The removed portion of mandrel 109b may have a width $W_C$ that is at least three times the critical dimension. In addition, the patterns on the cut mask can be produced to a desired angle such that the sidewalls at the ends of remaining mandrel 109b are at desired angles (as seen from a top view) with respect to conductive lines 119b or 119d. The desired angle may be 90°, in accordance with some embodiments.

Figure 2B:
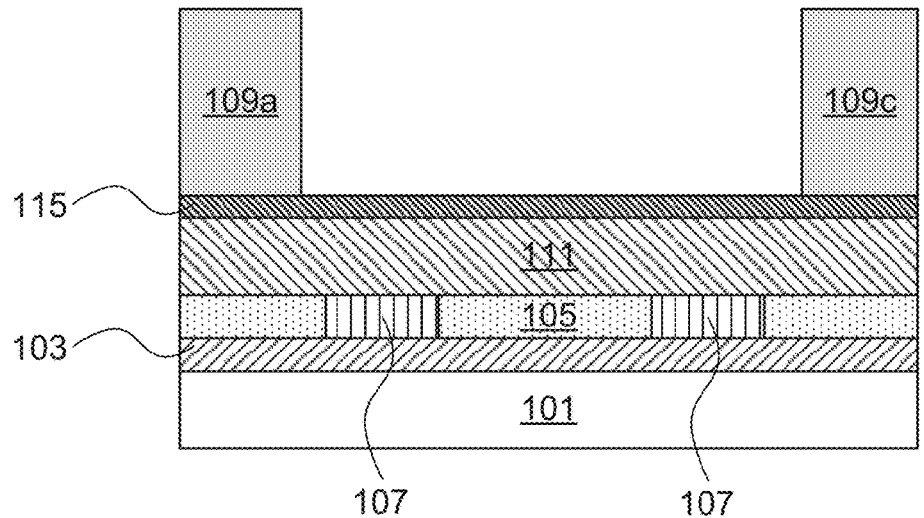
FIG. 2B is a cross-sectional view of the partially fabricated, exemplary electrical interconnect arrangement of FIG. 2A taken across line B-B, after a photolithography process.

FIG. 2B is a cross-sectional view of integrated circuit 100 along line B-B in FIG. 2A. As shown in FIG. 2B, a portion of mandrel 109b is removed, and during the removal process, hard mask layer 115 is used as an etch stop.

Figure 3A:
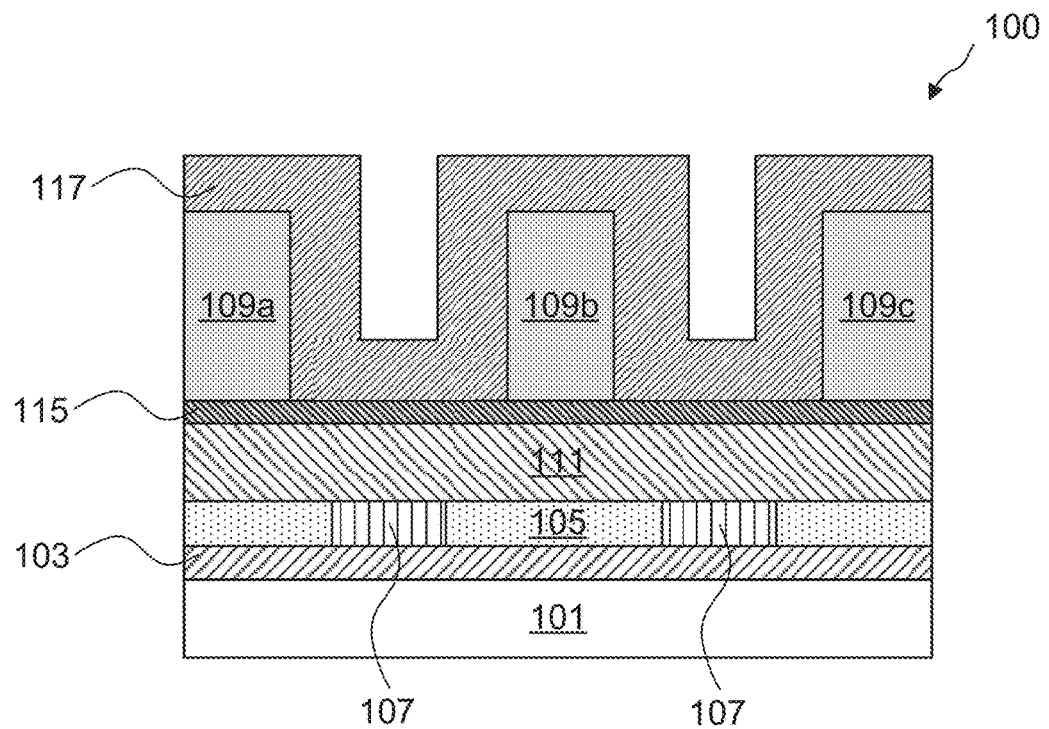
FIG. 3A is a cross-sectional view of the partially fabricated, exemplary electrical interconnect arrangement of FIG. 2A taken across line A-A, after a spacer deposition process, in accordance with some embodiments.
Figure 3B:
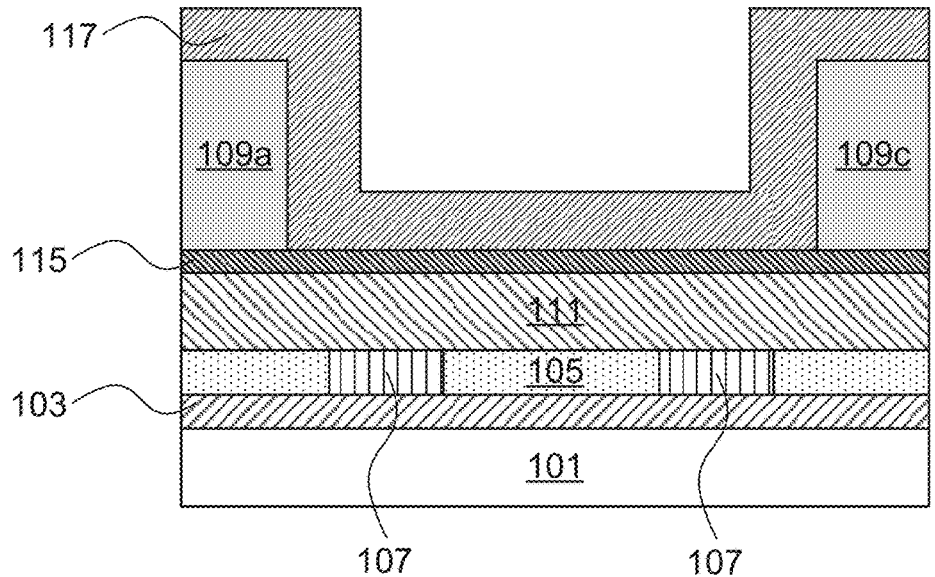
FIG. 3B is a cross-sectional view of the partially fabricated, exemplary electrical interconnect arrangement of FIG. 2A taken across line B-B, after a spacer deposition process, in accordance with some embodiments.

FIGS. 3A and 3B are cross-sectional views of integrated circuit 100 along lines A-A and B-B in FIG. 2A, respectively, after spacer layer 117 is deposited on the surface of integrated circuit 100. Spacer layer 117 is isotropically deposited on the exposed surfaces of integrated circuit 100, which include the exposed surfaces of hard mask layer 115 and the top and side surfaces of mandrels 109a-109c. Spacer layer 117 is formed equally on the exposed surfaces, and its thickness is equal to or greater than the critical dimension. Spacer layer 117 may be formed of TiO, silicon oxide, silicon nitride, TiN, $SiC_xO_yN_z$ (x, y, z=0~n), and/or other suitable insulating material. Spacer layer 117 may be formed by chemical oxidation, thermal oxidation, atomic layer deposition (ALD), chemical vapor deposition (CVD), and/or other suitable formation process. Any other suitable dielectric material formed using any other suitable process may alternatively be utilized. The spacer layer, hard mask layer, and mandrels are preferably comprised of different materials so as to provide different etch selectivities for subsequent removal processes.

Figure 4:
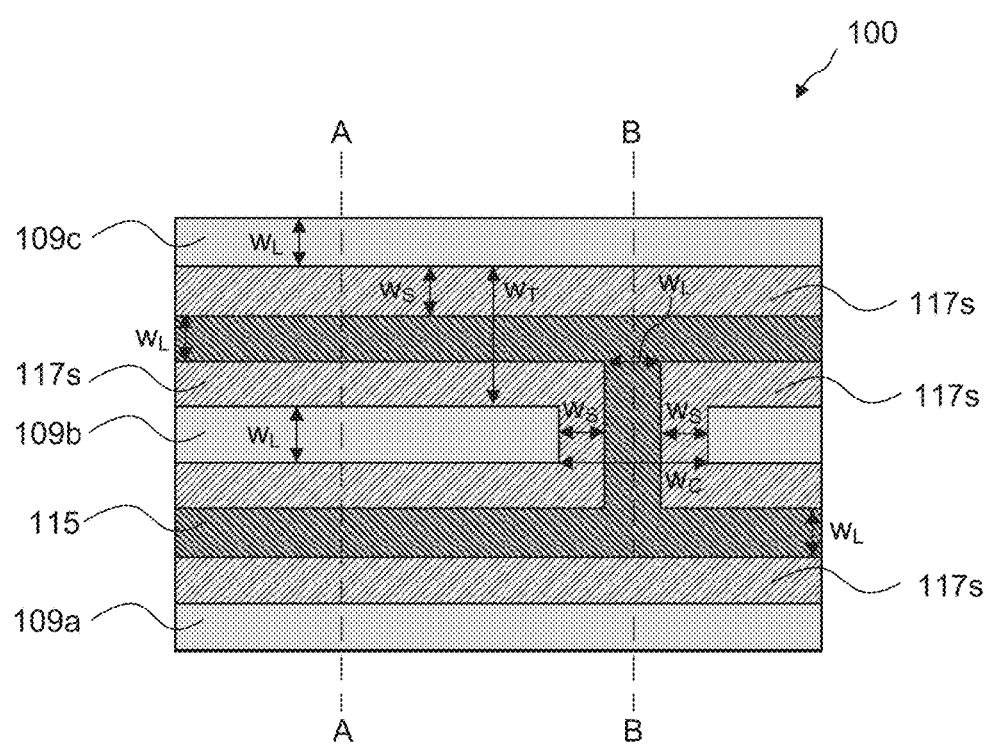
FIG. 4 is a top view of the partially fabricated, exemplary electrical interconnect arrangement after a spacer layer removal process, in accordance with some embodiments.

FIG. 4 is a top view of integrated circuit 100 after a portion of spacer layer 117 has been removed using a removal process. Spacer layer 117 is anisotropically etched back in the vertical direction with reference to the substrate surface, forming spacers 117s that are adjacent to the respective sidewalls of mandrels 109a-109c. This is realized primarily through an anisotropic etching process, where etching of spacer layer 117 is much faster in the vertical direction than the horizontal direction with reference to the substrate surface. Such etching process is realized through appropriate plasma or wet chemical etching, depending on the material that formed spacer layer 117. After the removal process, spacers 117s are only on the sidewalls of mandrels 109a, 109b, and 109c. The deposition and etching process of spacer layer 117 can be configured such that the width $W_S$ of spacers 117s is equal to the critical dimension. As discussed above with reference to FIGS. 1A-1B and FIGS. 2A-2B, separations $W_T$ and $W_C$ are both approximately equal to three times the critical dimension, and since each spacer 117s has width $W_S$ that is approximately equal to the critical dimension, the exposed hard mask layer 115 that is located between spacers 117s has width $W_L$ that also approximately equals the critical dimension.

Figure 5A:
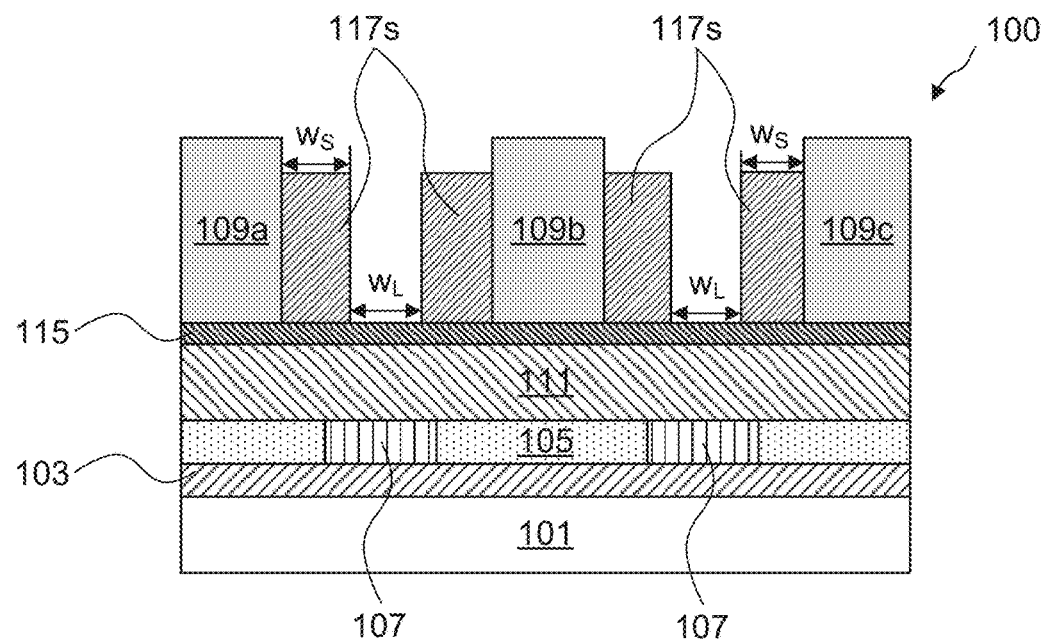
FIG. 5A-5B are cross-sectional views of the partially fabricated, exemplary electrical interconnect arrangement of FIG. 4 taken across lines A-A and B-B, respectively, after the spacer removal process.
Figure 5B:
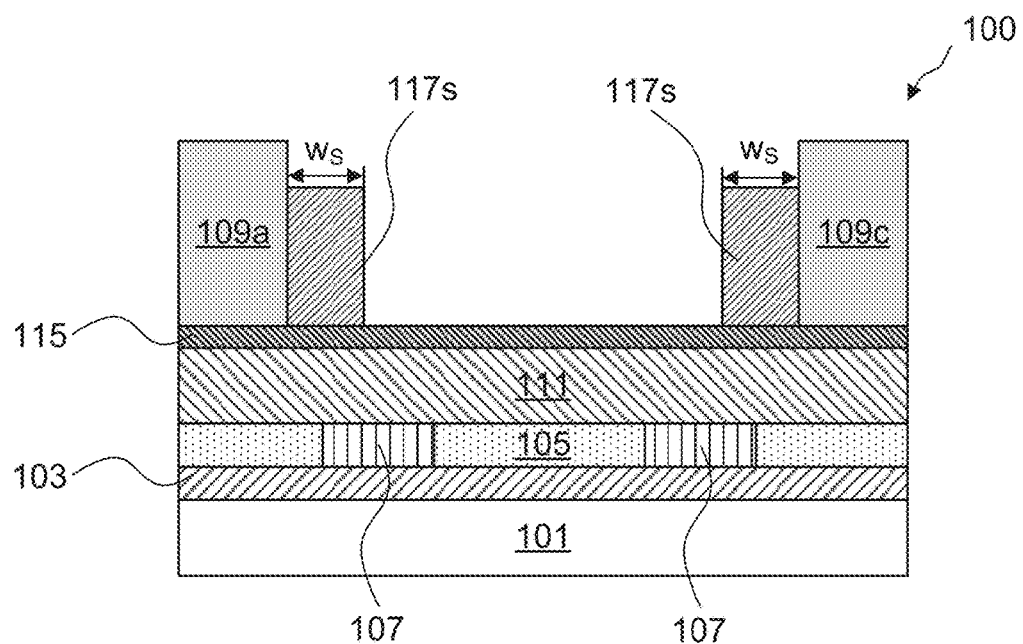

FIGS. 5A and 5B are cross-sectional views of integrated circuit 100 along lines A-A and B-B in FIG. 4, respectively. As discussed above, spacer layer 117 is anisotropically etched back in the vertical direction with reference to the substrate surface, forming spacers 117s. The deposition and etching process of spacer layer 117 can be configured such that the width $W_S$ of spacers 117s is equal to the critical dimension. The height of the spacers 117s may be slightly less than the height of the mandrels 109a-109c due to the etching process. A portion of hard mask layer 115 is exposed between spacers 117s.

In FIG. 5A, by adjusting the mandrel separation and the deposition/etching process of spacer layer 117, the exposed portion of hard mask layer 115 may have a width that is approximately equal to the critical dimension after the etching process of spacer layer 117.

In FIG. 5B, since a portion of mandrel 109b is removed, hard mask layer 115 would be exposed between spacers 117s of mandrels 109a and 109c and between spacers 117s of the remaining mandrel 109b.

Figure 6A:
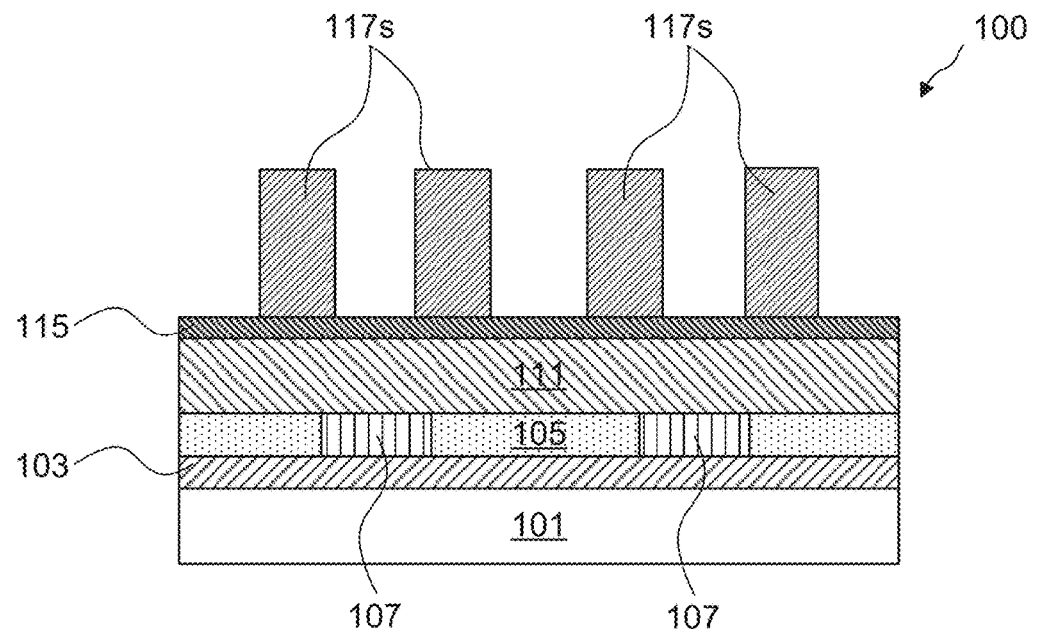
FIGS. 6A-6B are cross-sectional views of the partially fabricated, exemplary electrical interconnect arrangement of FIG. 4 taken across lines A-A and B-B, respectively, after a mandrel removal process, in accordance with some embodiments.
Figure 6B:
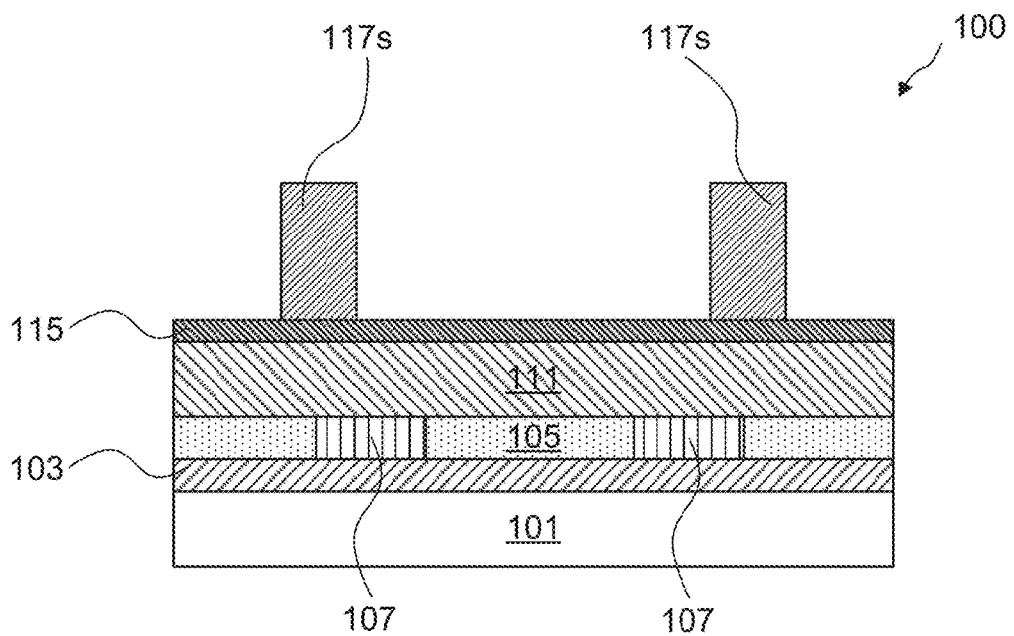

FIGS. 6A and 6B are cross-sectional views of integrated circuit 100 along lines A-A and B-B in FIG. 4, respectively, after the removal of mandrels 109a-109c. Mandrels 109a-109c are removed using any appropriate etching process, including but not limited to plasma etching or wet chemical etching, depending on the mandrel material. The etching process selectively etches away the mandrel material and uses hard mask layer 115 as an etch stop. The removal process may also include a photolithography process.

Figure 7A:
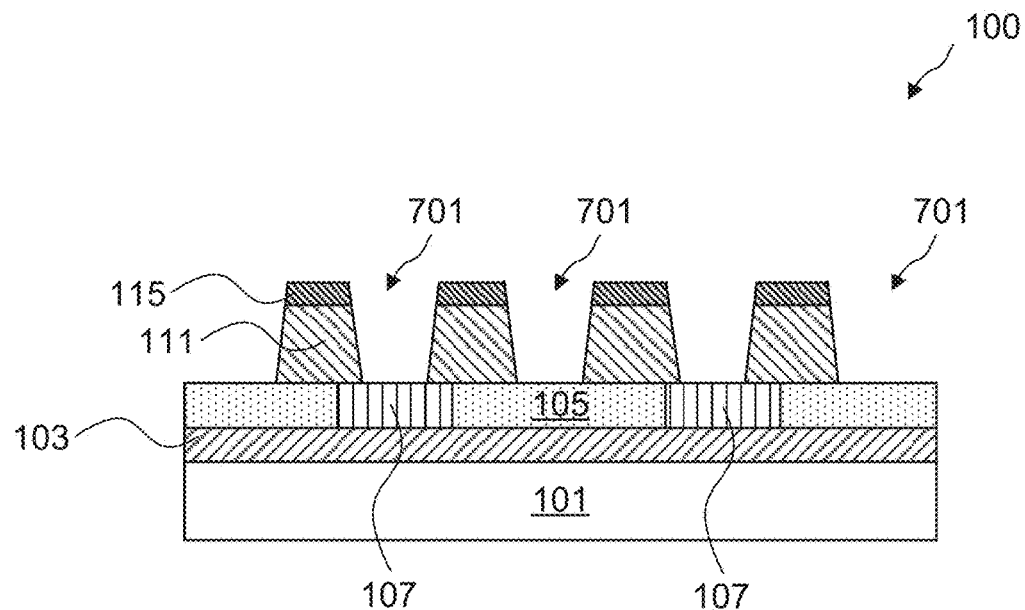
FIGS. 7A-7B are cross-sectional views of the partially fabricated, exemplary electrical interconnect arrangement of FIG. 4 taken across lines A-A and B-B, respectively, after forming trenches between spacers, in accordance with some embodiments.
Figure 7B:
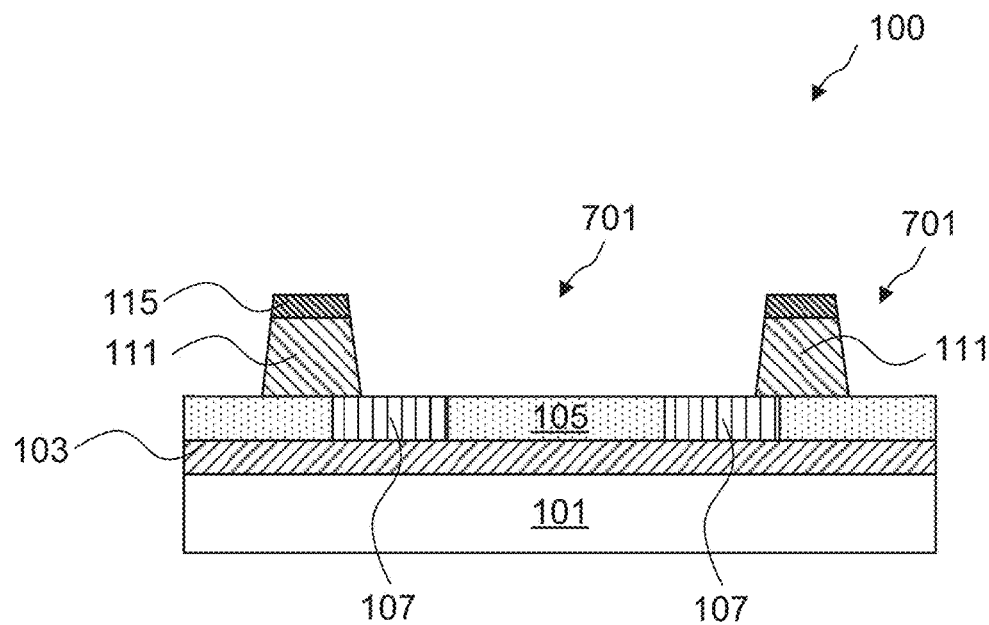

FIGS. 7A and 7B are cross-sectional views of integrated circuit 100 along lines A-A and B-B in FIG. 4, respectively, after the removal of portions of hard mask layer 115, and portions of second dielectric 111 that are exposed between spacers 117s. Using spacers 117s illustrated in FIGS. 6A and 6B as etching masks, one or more etching processes are performed on the exposed area between spacers 117s. As such, the pattern formed by spacers 117s is subsequently transferred onto hard mask layer 115 and extended through second dielectric layer 111. The etching process may continue until first dielectric layer 105 and conductive regions 107 are at least partially exposed. The sidewall slope of remaining hard mask layer 115 and second dielectric layer 111 may be perpendicular or nearly perpendicular to first dielectric layer 105, depending on the etching process. The etching process results in trenches 701 that are formed in between adjacent pillars of remaining second dielectric 111 and hard mask layer 115.

Figure 8:
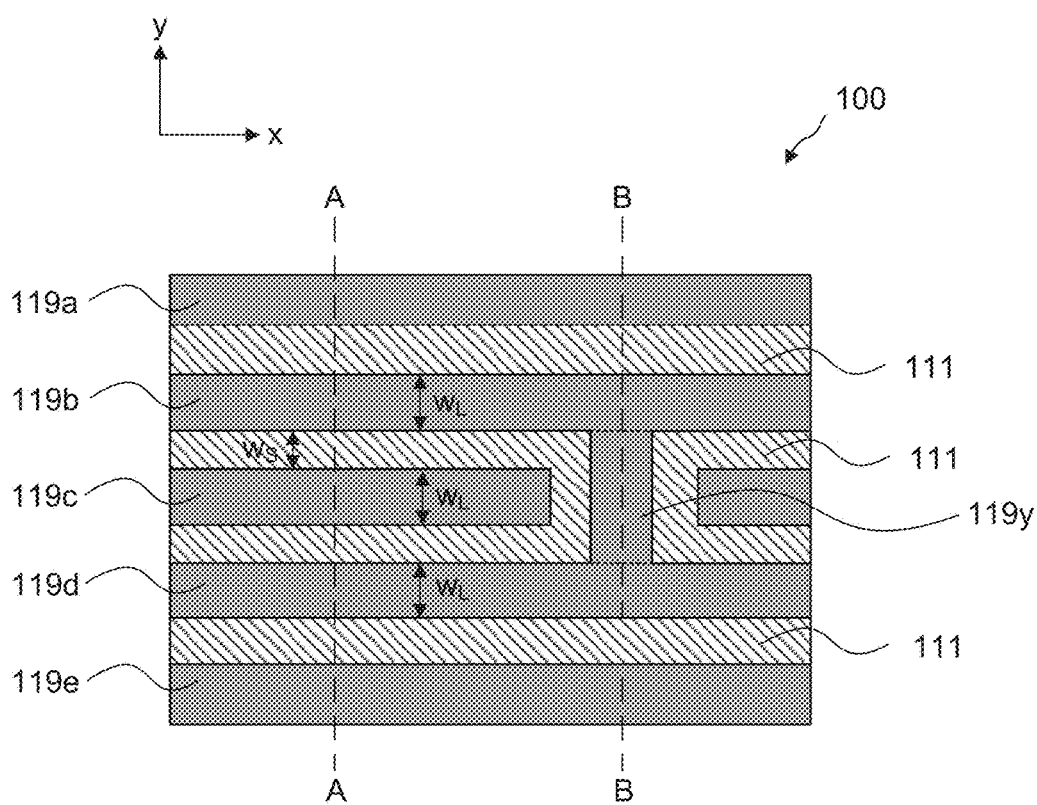
FIG. 8 is a top view of the partially fabricated, exemplary electrical interconnect arrangement after filling the trenches with conductive material, and subsequently polishing and planarizing the top surface, in accordance with some embodiments.

FIG. 8 is a top view of integrated circuit 100 after filling trenches 701 with conductive material, and subsequently polishing and planarizing the top surface.

The filling process may begin with a lining process (not illustrated in FIG. 8) where a liner layer is formed along the sidewalls and bottom of trenches 701. The liner layer may be formed using a plasma enhanced chemical vapor deposition (PECVD) process, although other suitable processes, such as physical vapor deposition or a thermal process, may alternatively be used.

Once the liner layer is formed along the sidewalls and bottom of trenches 701, trenches 701 may be filled with conductive metal. The conductive material may comprise copper, although other suitable materials such as aluminum, alloys, doped polysilicon, combinations thereof, and the like, may alternatively be used. The conductive material may be formed by electroplating copper onto a seed layer (not shown), filling and trenches 701. Once trenches 701 have been filled, excess liner, seed layer, and conductive material outside of trenches 701 may be removed through a planarization process such as CMP, although any suitable removal process may be used. During this planarization process, remaining hard mask layer 115 may also be removed, exposing the underlying second dielectric layer 111.

The filling process forms conductive lines 119a-119e in trenches 701. As shown in FIG. 8, conductive lines 119a-119e are in the x-direction and can be divided into odd numbered lines 119a, 119c, and 119e, and even numbered lines 119b and 119d. It should be noted that the definition of odd and even numbered lines here is simply used for illustrative purposes. Each conductive line may have width $W_L$ that is approximately equal to the critical dimension. FIG. 8 illustrates that even lines 119b and 119d are electrically connected via interconnect 119y. Conductive interconnect 119y provides connections in the y-direction that is perpendicular to x-direction conductive lines 119b and 119d. As described above, the respective widths $W_S$ and $W_L$ of spacers 117s and mandrel 109b are both approximately equal to the critical dimension. Therefore, the spacing between the parallel portions of conductive lines 119b and 119d outside of where they are connected by conductive interconnect 119y is approximately equal to three times the critical dimension. For example, if the critical dimension equals to 5 nm the separation between conductive lines 119b and 119d would be 15 nm.

Figure 9A:
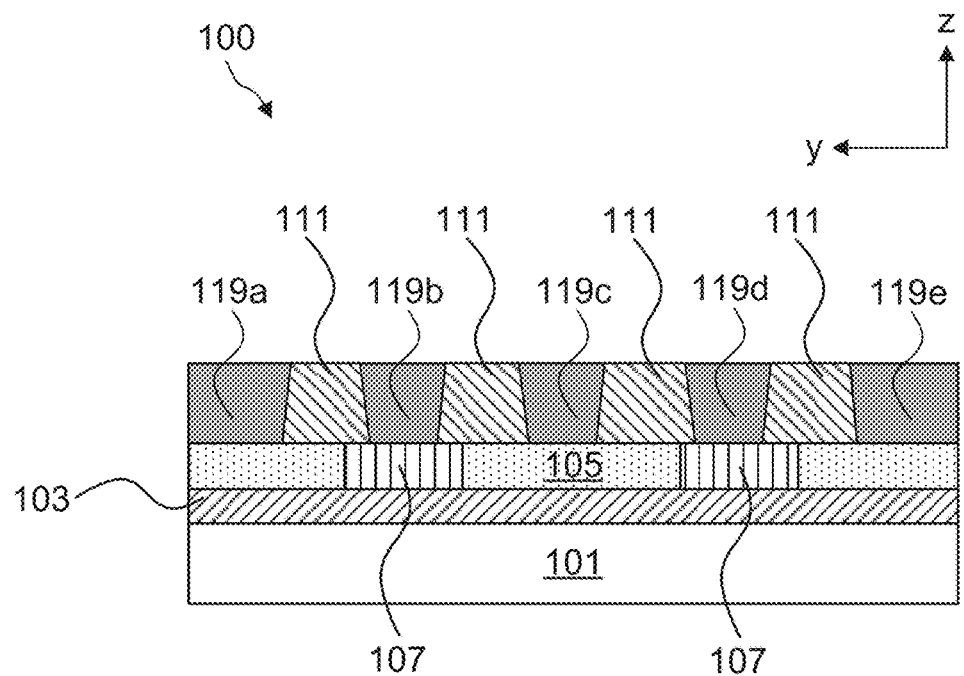
FIGS. 9A-9B are cross-sectional views of the partially fabricated, exemplary electrical interconnect arrangement of FIG. 8 taken across lines A-A and B-B, respectively, after filling the trenches with conductive material, and subsequently polishing and planarizing the top surface, in accordance with some embodiments.
Figure 9B:
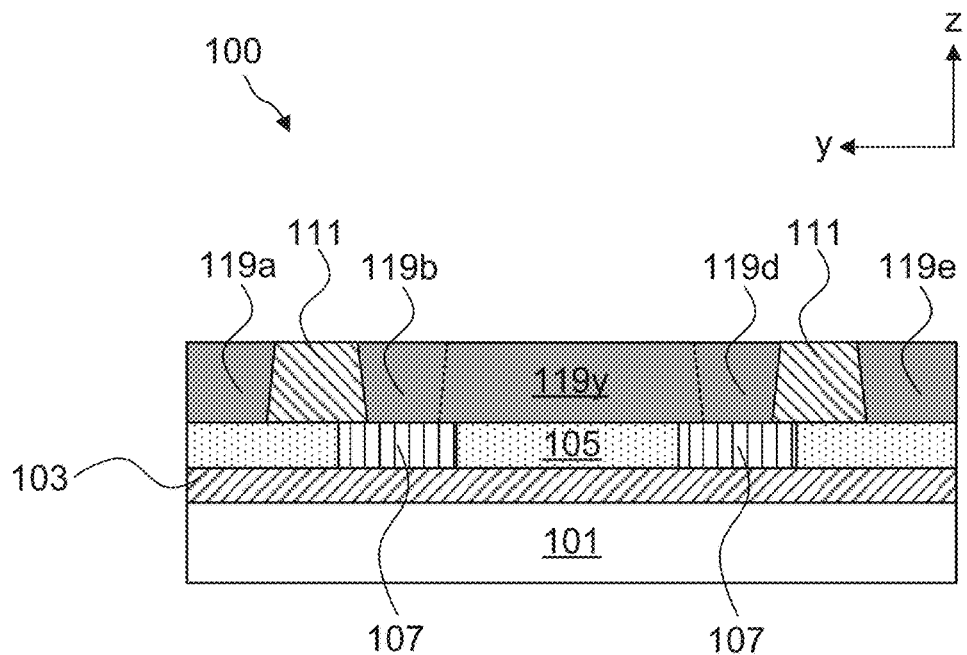

FIGS. 9A and 9B are cross-sectional views of integrated circuit 100 along lines A-A and B-B in FIG. 8, respectively, after filling trenches 701 with conductive material, and subsequently polishing and planarizing the top surface. As discussed above with reference to FIG. 8, the filing process may begin with a lining process (not illustrated in FIGS. 9A or 9B) where a liner layer is formed along the sidewalls and bottom of trenches 701. The trenches are then filled with conductive metal to form conductive lines 119a-119e, and adjacent conductive lines are separated by first dielectric layer 111. However, in FIG. 9B, conductive interconnect 119y provides electrical connection in the y-direction between x-directional even lines 119b and 119d.

As discussed above with reference to FIG. 8, a planarization process such as CMP is used to remove the excess liner layer, seed layer, and conductive material outside of the trenches. As shown in FIGS. 9A and 9B, hard mask layer 115 is also removed in this process, exposing top surfaces of second dielectric layer 111. As a result of the planarization process, top surfaces of conductive lines 119a-119e, conductive interconnect 119y, and second dielectric layer 111 are substantially co-planar. Further, conductive lines 119a-119e, conductive interconnect 119y are on a same metallization level.

In addition, as trenches are formed to at least partially expose conductive regions 107, at least a subset of conductive lines 119a-119e and conductive interconnect 119y are electrically connected to conductive regions 107, providing electrical connection between multiple layers of integrated circuit 100.

Figure 10:
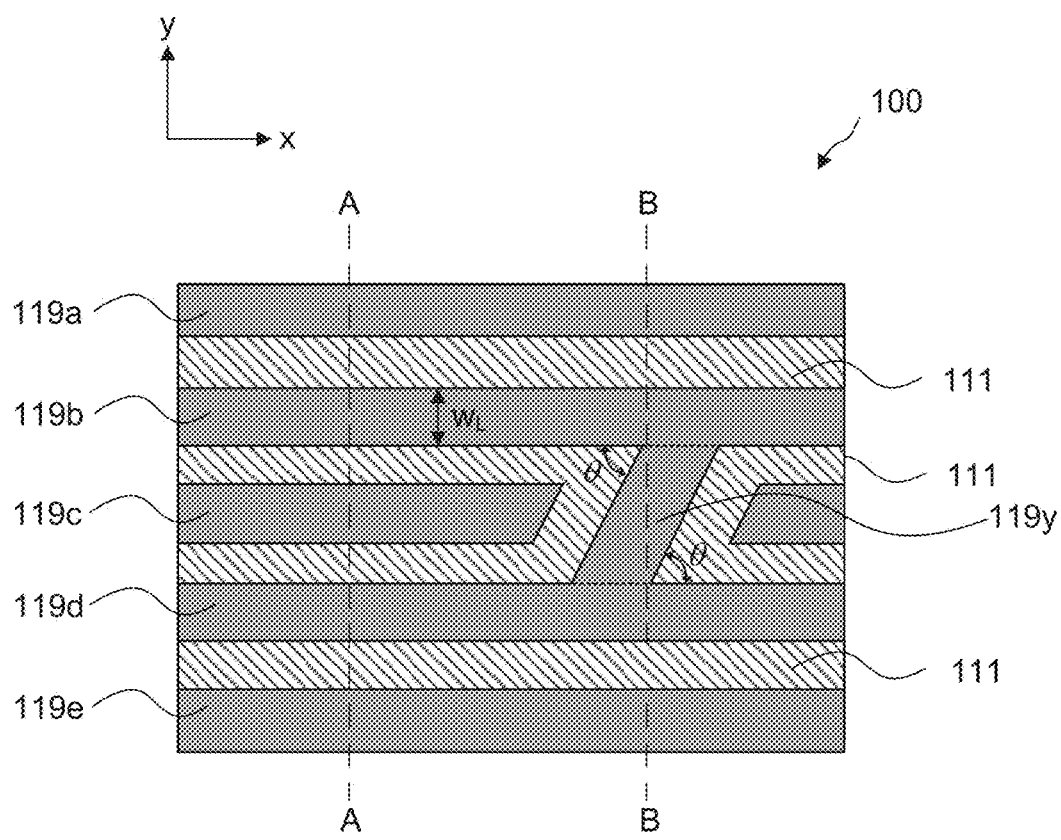
FIG. 10 is a top view of an exemplary embodiment of an electrical interconnect arrangement with conductive lines formed at a desired angle, in accordance with some embodiments.

FIG. 10 is a top view of integrated circuit 100 with a conductive interconnect 119y that is formed at a desired angle with the conductive lines. As discussed above, conductive interconnect 119y may be perpendicular to conductive lines 119b or 119d as shown in FIG. 8. However, it is also possible to produce a cut mask such that conductive interconnect 119y is formed at an angle θ with reference to conductive lines 119b or 119d. Angle θ may be any desired angle depending on the device needs, including but not limited to, 45° or 60°. This can be achieved by producing patterns on the cut mask to the desired angle such that the angle is transferred to the sidewalls at the ends of remaining mandrel 109b.

Figure 11:
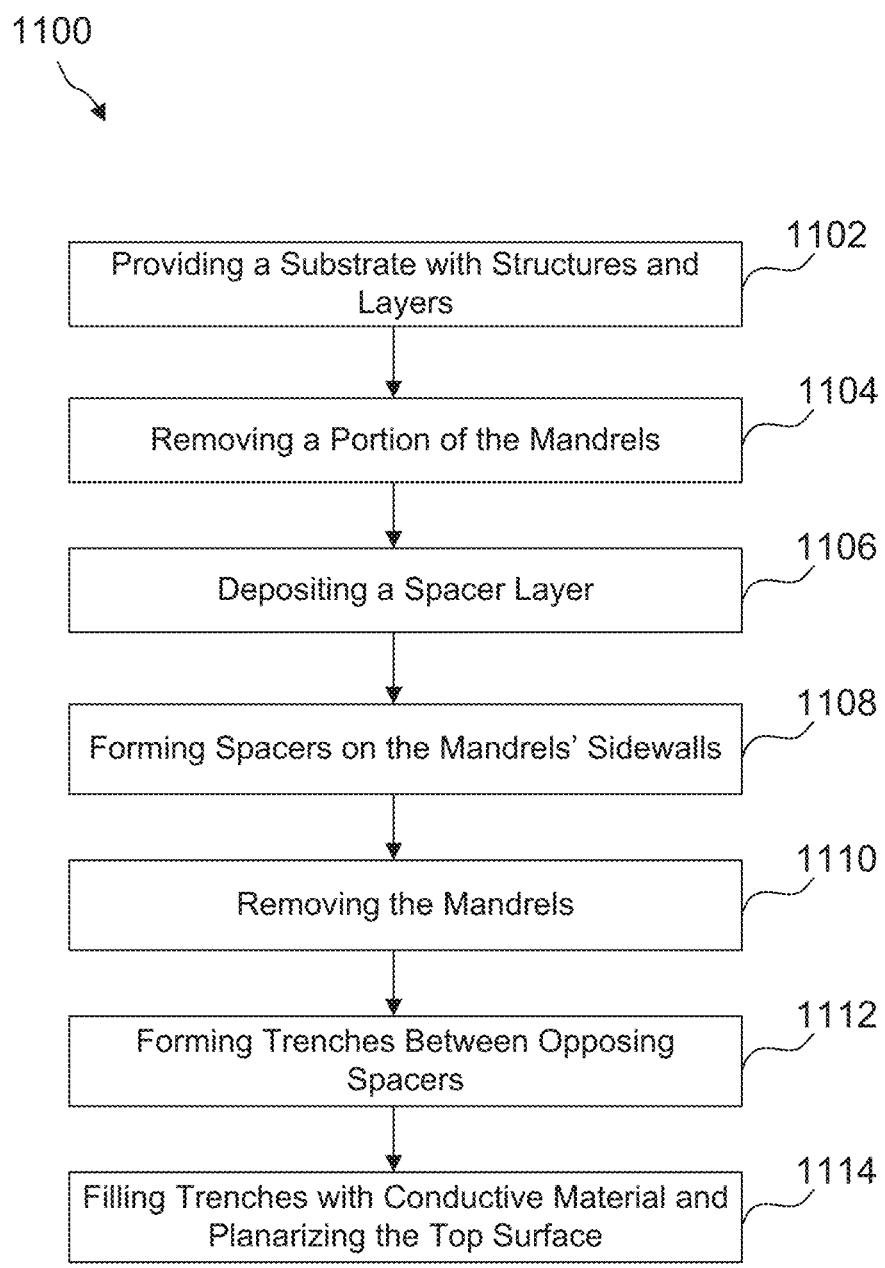
FIG. 11 is a flow diagram of an exemplary process of forming an electrical interconnect arrangement suitable for use in integrated circuits having orientationally-constrained layouts.

FIG. 11 is a flow diagram of an illustrative method 1100 of forming 2-D conductive interconnections for integrated circuits. The method provided here is exemplary. In alternative embodiments other operations may be performed and are omitted here for simplicity. Operations can be performed in a different order or not performed depending on specific applications.

Method 1100 begins with operation 1102, providing a semiconductor substrate with structures and layers formed on and/or within. The semiconductor substrate may comprise bulk silicon, doped or undoped, or an active layer of a silicon-on-insulator (SOI) substrate. The semiconductor substrate may comprise semiconductor material such as silicon, germanium, silicon germanium, silicon germanium on insulator (SGOI), or combinations thereof.

Active devices may be formed on and/or within the semiconductor substrate. A wide variety of active and passive devices such as transistors, diodes, capacitors, resistors, inductors and the like may be used to generate the desired structural and functional requirements of the design for the integrated circuit.

A multi-level interconnect layer is formed over the semiconductor substrate and the active devices, and is configured to connect the various active devices to form circuitry. The multi-level interconnect layer may be formed of alternating layers of dielectric and conductive material and may be formed through any suitable process.

A first dielectric layer is formed over the metallization layers. The first dielectric layer may be a dielectric material comprising silicon oxide, silicon nitride, silicon oxynitride, fluorine-doped silicate glass (FSG), a low-k dielectric material, $SiC_xO_yN_z$ (x, y, z=0~n), and/or other suitable insulating material.

Conductive regions are formed within openings in the first dielectric layer. Conductive regions are regions to which an interconnect will make an electrical connection. The conductive regions are conductive lines made from, e.g., copper, although any other suitably conductive material may alternatively be utilized. The conductive regions may be formed using a damascene process.

A second dielectric layer and a hard mask layer are formed over the conductive regions and the first dielectric layer. The second dielectric layer is made of a dielectric material such as but not limited to, silicon oxide, silicon nitride, silicon oxynitride, fluorine-doped silicate glass (FSG), a low-k dielectric material, $SiC_xO_yN_z$ (x, y, z=0~n), and/or other suitable insulating material. The hard mask layer is made of dielectric material such as but not limited to, silicon oxide, silicon nitride, TiN, Si, TiO, WC, $SiC_xO_yN_z$ (x, y, z=0~n), and/or other suitable insulating material.

Mandrels are fin-shaped dielectric structures that are formed over the hard mask layer. Their height may be about one to three times of the critical dimension, and the width may be as small as the critical dimension, depending on the device needs. Mandrel separation is at least three times the critical dimension. The mandrels are made of non-metallic dielectric material, for example, silicon oxide, silicon nitride, TiN, Si, TiO, WC, $SiC_xO_yN_z$ (x, y, z=0~n), and/or other suitable insulating material.

The structures and layers formed on the semiconductor substrate may be formed by chemical oxidation, thermal oxidation, atomic layer deposition (ALD), chemical vapor deposition (CVD), and/or other suitable formation process. Any other suitable dielectric material formed using any other suitable process may alternatively be utilized. Other process may be included in the formation process, for example, a photolithography process or a CMP process.

Method 1100 continues with operation 1104, removing a portion of the mandrels using a photolithography process and an etching process. During the removal process, the hard mask layer is used as an etch stop. More than one mandrel may undergo such removal process to form more than one conductive interconnects.

The removed portion of mandrel may have a width at least three times the critical dimension, and the sidewalls at the ends of the remaining mandrel are at desired angles with respect to the conductive lines. For example, the sidewalls at the ends of the remaining mandrel may be perpendicular to the conductive lines, or in another example, they could be at an angle other than 90°, such as but not limited to, 30°, 45°, or 60°.

Method 1100 continues with operation 1106, depositing a spacer layer on the surface of the integrated circuit. The spacer layer is isotropically deposited on the exposed surfaces of integrated circuit, which include the exposed surfaces of hard mask layer and the top and side surfaces of the mandrels. The spacer layer is deposited equally on the exposed surfaces, and its thickness is equal to or greater than the critical dimension.

Method 1100 continues with operation 1108, forming spacers that are adjacent to the respective sidewalls of mandrels. This can be achieved through anisotropically etching back the spacer layer in the vertical direction with reference to the substrate surface. After the removal process, spacers are only present on the sidewalls of mandrels. The deposition and etching process of the spacer layer can be configured such that the width of the spacers is approximately equal to the critical dimension. As a result, the exposed hard mask layer located between spacers has a width that is approximately equal to the critical dimension. The ends of the remaining mandrels that are formed in operation 1104 also have spacers formed thereon, and the spacers are separated by a distance approximately equal to the critical dimension.

Method 1100 continues with operation 1110, removing mandrels using an appropriate etching process. The etching process includes but is not limited to plasma etching or wet chemical etching, depending on the mandrel material. The etching process selectively etches away the mandrel material and uses hard mask layer as an etch stop.

Method 1100 continues with operation 1112, forming trenches by removing portions of the hard mask layer and the second dielectric that are exposed between the spacers. Using the spacers as etching masks, one or more etching processes are performed on the exposed area between the spacers. As such, the patterns formed by the spacers are subsequently transferred onto the hard mask layer and extended through the second dielectric layer. The etching process may continue until the first dielectric layer and the conductive regions are at least partially exposed. The etching process results in trenches that are formed in between adjacent pillars of the remaining second dielectric layer and hard mask layer.

Method 1100 continues with operation 1114, filling the trenches with conductive material, and subsequently polishing and planarizing the top surface. The filling process may begin with a lining process where a liner layer is formed along the sidewalls and bottom of the trenches. Once the liner layer is formed, the trenches may be filled with conductive metal, such as copper. The conductive material may be formed by electroplating copper onto a seed layer, and filling, or overfilling, the trenches. Once the trenches have been filled or overfilled, excess liner, seed layer, and conductive material outside of the trenches may be removed by a planarization process. During this planarization process, the remaining hard mask layer may also be removed, exposing the underlying second dielectric layer.

The filling process forms conductive lines and conductive interconnects in the trenches. The terms conductive lines and conductive interconnects are only used here to differentiate between the x-direction and y-direction lines, and that they are formed using the same material and through the same process. The conductive lines and conductive interconnects are in the x-direction and y-direction respectively, and have widths that equal to the critical dimension. In this way, odd or even numbered conductive lines are electrically connected via the conductive interconnects. As discussed above, the conductive interconnects may be perpendicular to the conductive lines, or formed at a desired angle.

Various embodiments in accordance with this disclosure provide methods of producing two-dimensional interconnect layouts in a one-dimensional patterning layout for integrated circuits. Specifically, even or odd numbered lines in the x-direction of the 1-D patterning layout can be connected through 2-D interconnects in the y-direction. The 2-D interconnects may be perpendicular or at a desired angle with respect to the even or odd numbered lines. Methods in accordance with this disclosure provide the freedom of two-dimensional patterning compared to conventional SAMP processes used in the 1-D patterning processes. One benefit of the methods in accordance with this disclosure is that the line widths of the both the even or odd numbered lines and the 2-D interconnects can be configured to match the critical dimension of the conventional SAMP process.

Another benefit of the methods in accordance with this disclosure is that only minimum area is needed to achieve 2-D interconnect between 1-D lines, and that the separation between the 1-D lines or between 2-D interconnects and the end of 1-D lines can be kept to a constant and at a minimum. The constant minimum separation may be as low as the critical dimension of a SAMP process or the resolution limit of the lithography apparatus used for fabricating the semiconductor structures in this disclosure, for example, the critical dimension may be 5 nm. The constant minimum separation also provides the benefit that line-to-line leakage can be prevented in spite of overlay concerns.

The capability of a 2-D layout in a 1-D based patterning provides the further benefit of an increased logic density and decreased metal layer stacking in integrated circuits. For example, in a transmission gate or tie-off circuit where 2-D interconnections are advantageous. Using such methods, the size of logic cells which contain transmission gates could be reduced in the y-direction.

In one embodiment, a method includes providing a substrate and forming a plurality of dielectric structures over the substrate, where the dielectric structures have sidewalls. At least a first and a second dielectric structure of the plurality of dielectric structures are disposed so that they are parallel to each other. A portion of the first dielectric structure is removed to form second sidewalls and the removed portion has a width that is approximately three times a critical dimension. A spacer is formed on each of the first and second sidewalls, and the plurality of dielectric structures are removed. Trenches are formed in areas of the substrate that are not protected by the plurality of spacers, and the trenches have widths approximately equal to the critical dimension. Conductive material is disposed in the trenches to form a plurality of conductive lines, and at least a first and a second conductive line are connected and not in parallel with each other.

In another embodiment, a method of forming two-dimensional interconnections on a substrate includes providing a substrate having a hard mask layer formed over a first layer and forming a plurality of non-metallic elements over the hard mask layer. Each one of the plurality of non-metallic elements are parallel to each other. The method further comprises patterning at least one non-metallic element of the plurality of non-metallic elements by forming a patterned photoresist layer on the at least one non-metallic element and etching the at least one non-metallic element using the patterned photoresist layer to form first and second portions of the at least one non-metallic element with a space between the first and second portions. The space has a width that is approximately equal to three times a critical dimension. The method also includes disposing a spacer layer on the substrate and anisotropically etching the spacer layer to form spacers on sidewalls of the non-metallic elements, wherein the width of the spacers approximately equals to the critical dimension. The method further includes removing the non-metallic elements using an etching process, etching the hard mask layer and substrate to form trenches using the spacers as a masking element, and disposing conductive material in the trenches to form conductive lines having a width approximately equal to the critical dimension. At least one conductive line is formed between the first and second portions and is physically contacting another conductive line of the plurality of conductive lines.

In a further embodiment, a device comprises a dielectric layer over a substrate, and also comprises first, second, and third conductive lines having widths of 5 nm or less. The conductive lines comprise respective trench portions extending through the dielectric layer. The first and third conductive lines are parallel with each other and are connected through the second conductive line.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method of forming interconnections, comprising:
forming a plurality of dielectric structures having first sidewalls over a substrate, wherein at least a first and a second dielectric structure of the plurality of dielectric structures are parallel with each other;
removing a portion of the first dielectric structure to form second sidewalls that are not parallel with the first sidewalls in a plan view of the interconnections, wherein the removed portion has a first width;
forming a spacer on each of the first and second sidewalls;
removing the plurality of dielectric structures;
forming trenches in areas of the substrate not protected by the spacer on each of the first and second sidewalls, wherein the trenches have a second width that is 5 nm or less and equals to one third of the first width; and
disposing conductive material in the trenches to form a plurality of conductive lines, wherein at least a first and a second conductive line of the plurality of conductive lines are in physical contact with each other and intersect with each other.

2. The method of claim 1, wherein each of the plurality of dielectric structures has a height between one to three times the second width, and a width that equals the second width.

3. The method of claim 1, wherein one of the first and second conductive lines is formed between the second sidewalls.

4. The method of claim 1, further comprising polishing the plurality of conductive lines and the substrate to form a planarized surface.

5. The method of claim 1, wherein the plurality of spacers have widths equal to the second width.

6. The method of claim 1, wherein the first and second conductive lines are perpendicular to each other.

7. The method of claim 1, wherein the first and second conductive lines are connected at an angle of less than 90 degrees with respect to each other.

8. The method of claim 1, wherein forming the plurality of spacers comprises isotropically disposing a spacer layer over the substrate and anisotropically etching the spacer layer.

9. A method of forming a semiconductor structure, the method comprising:
providing a substrate having a hard mask layer;

forming a plurality of non-metallic elements over the hard mask layer, wherein each one of the plurality of non-metallic elements is parallel to one another in a plan view of the semiconductor structure;

etching at least one non-metallic element to form first and second portions of the at least one non-metallic element, wherein a space between the first and second portions equals to a first dimension;

disposing a spacer layer on the substrate and etching the spacer layer to form spacers on sidewalls of the plurality of non-metallic elements, wherein a width of the spacers equals to a second dimension that is between 5 nm and 30 nm and equals to one third of the first dimension;

removing the plurality of non-metallic elements;

etching the hard mask layer and substrate using the spacers as a masking element to form first and second trenches, wherein the first and second trenches intersect with each other and extend along respective first and second directions that are different from each other in the plan view; and disposing conductive material in the first and second trenches to respectively form first and second conductive lines, wherein the first and second conductive lines are in physical contact with each other.

10. The method of claim 9, wherein a height of the plurality of non-metallic elements equals to one to three times the second dimension and a width of the plurality of non-metallic elements equals to the second dimension.

11. The method of claim 9, wherein a width of the first and second conductive lines equals to the second dimension.

12. The method of claim 9, wherein the first conductive line is formed in a space between the first and second portions.

13. The method of claim 9, wherein the first conductive line is perpendicular to the second conductive line in the plan view.

14. The method of claim 9, wherein the first and second conductive lines are in physical contact at an angle of 45 degrees with respect to each other.

15. A method of forming a semiconductor structure, the method comprising:

forming a plurality of fin-shaped structures on a substrate, wherein each one of the plurality of fin-shaped structures is parallel to one another;

etching at least one fin-shaped structure of the plurality of fin-shaped structures to form first and second portions of the at least one fin-shaped structure, wherein a space between the first and second portions equals to a first dimension;

forming spacers on sidewalls of the plurality of fin-shaped structures, wherein a width of the spacers equals to a second dimension that is 5 nm or less and equals to one third of the first dimension;

etching the substrate using the spacers as a masking element to form first and second trenches, wherein the first and second trenches intersect with each other and extend along respective first and second directions that are different from each other in a plan view of the semiconductor structure; and disposing conductive material in the first and second trenches to respectively form first and second conductive lines, wherein the first and second conductive lines are perpendicular to each other in the plan view.

16. The method of claim 15, further comprising removing the plurality of fin-shaped structures before etching the substrate.

17. The method of claim 15, wherein the first conductive line is formed between the first and second portions of the at least one fin-shaped structure.

* * * * *